United States Patent [19]

Sakamoto et al.

[11] Patent Number: 4,903,045
[45] Date of Patent: Feb. 20, 1990

[54] X-Y PLOTTER FOR NON-PERFORATED PAPER

[75] Inventors: Masami Sakamoto; Ryoichi Magumo; Tamio Ishihara, all of Katsuta; Takao Kobari, Hitachi, all of Japan

[73] Assignee: Hitachi, Ltd., Tokyo, Japan

[21] Appl. No.: 245,350

[22] Filed: Sep. 16, 1988

[30] Foreign Application Priority Data

Sep. 16, 1987 [JP] Japan .................. 62-229586

[51] Int. Cl.$^4$ .................. G01D 15/24; B65H 20/00
[52] U.S. Cl. .................. 346/136; 226/183
[58] Field of Search .................. 346/136, 139 R; 226/181, 188, 191, 183; 400/617, 636, 639

[56] References Cited

U.S. PATENT DOCUMENTS 4,683,480  7/1987  Sakamoto .................. 346/139 R

Primary Examiner—Teresa J. Walberg
Assistant Examiner—Mark Reinhart
Attorney, Agent, or Firm—Antonelli, Terry & Wands

[57] ABSTRACT

An X-Y plotter is of the type which moves a non-perforated recording paper by drive rollers and pinch rollers. The outer surface of each of the drive rollers is formed with a cylindrical reference surface and with a plurality of minute projections of sharp quadrangular pyramidal shape distributed over the whole outer surface of the roller. These reference surface and minute projections are formed by machining in the entire circumferential or outer surface of the drive roller a plurality of trapezoidal grooves extending parallel and orthogonally to the axis of the drive roller.

8 Claims, 2 Drawing Sheets

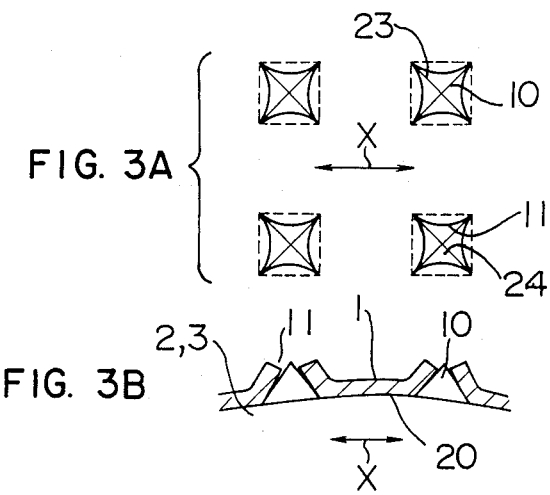
FIG. 3A
FIG. 3B
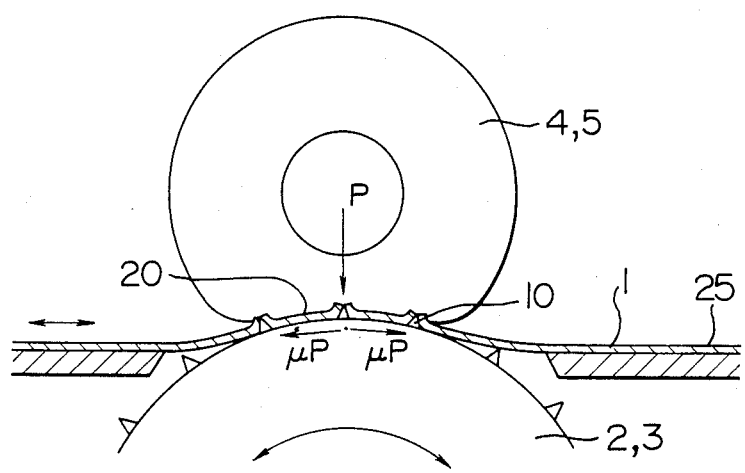
FIG. 4

X-Y PLOTTER FOR NON-PERFORATED PAPER

BACKGROUND OF THE INVENTION

This invention relates to an X-Y plotter, and more particularly, to an X-Y plotter of the type wherein a non-perforated recording paper is fed to the X-Y plotter for recording.

An X-Y plotter of this type, which requires no guide perforation in a recording paper, is disclosed, for example, U.S. Pat. No. 4,683,480, wherein since no guide perforation is required for the recording paper, and low-weight paper can be used, a high speed plotter can be obtained without using any complicated paper feed mechanism, resulting in a reduced sized X-Y plotter.

For developing an X-Y plotter of the above-mentioned type, one of the most important problems to be solved lies in its paper feed mechanism. There is required a special paper feed mechanism which can move or feed the paper in an exact manner without slippage with respect to the non-perforated paper.

The X-Y plotter of the above-mentioned U.S. Patent comprises a cylindrical drive or feed roller, the outer surface of which is formed with a plurality of projections fabricated by machining the surface in the circumferential and axial directions, with each of these projections having a top sharpened by machining, which thrusts into the paper, and prevents slippage between the paper and the roller.

The thrust depth of the projection, however, is not maintained constant, but varies in dependence upon the thickness or the hardness of the paper, because there is provided no means or reference plane which ensures to maintain the thrust depth of the projections constant. This unfavorable phenomenon of the prior art is significant in the case of a thin and flexible recording paper, where the thrust depth is gradually increased during a paper feeding operation, and at last adjacent thrust holes may be joined together, causing break down of the recording paper.

SUMMARY OF THE INVENTION

The object of this invention is to provide a X-Y plotter which is capable of exactly moving or feeding an unperforated recording paper irrespective of the thickness or the hardness of the paper.

The X-Y plotter of this invention comprises a cylindrical drive roller, having grooves each of a trapezoidal crosssectional shape on its outer surface formed by machining to be arranged in axial and circumferential direction thereof. As a result, the drive roller has a substantially cylindrical reference surface and a plurality of minute projections of a sharp quadriangular pyramidal shape projecting from the reference surface, with the projections being distributed over the entire outer surface of the roller with equal pitches in the axial and circumferential directions of the drive roller. Because the minute projection of sharp quadriangular pyramidal shape can easily be thrust into the paper, the minute thrust-holes and/or depressions produced in the paper serve for the paper feed to prevent slippage between the paper and the roller.

The cylindrical reference surface radially supports the non-thrusted portion of the paper, thereby preventing the projections from being thrust into the paper beyond a limit required and causing a break down of the same due to the unnecessarily enlarged thrust holes. Further, the paper is driven not only by the pushing forces from the minute or micro projections, but also by the frictional force from the reference surface of the roller, thereby reducing the stress around the thrust holes in the paper and minimizing the growth of the holes, which feature is especially desirable for a thin recording paper.

Still further, since the recording paper is moved while maintained in contact with the cylindrical reference surface, the accuracy of the fed length of the paper can be enhanced resulting in a steady feeding of the paper.

BRIEF DESCRIPTION OF THE DRAWINGS

FIGS. 3A and 3B are an enlarged plan view and cross sectional view, respectively, of sharp projections thrusting into a recording paper;

FIG. 4 is a partial cross sectional view of the paper feed mechanism showing driving forces acting on the recording paper.

DESCRIPTION OF THE PREFERRED EMBODIMENT

Figure 1:
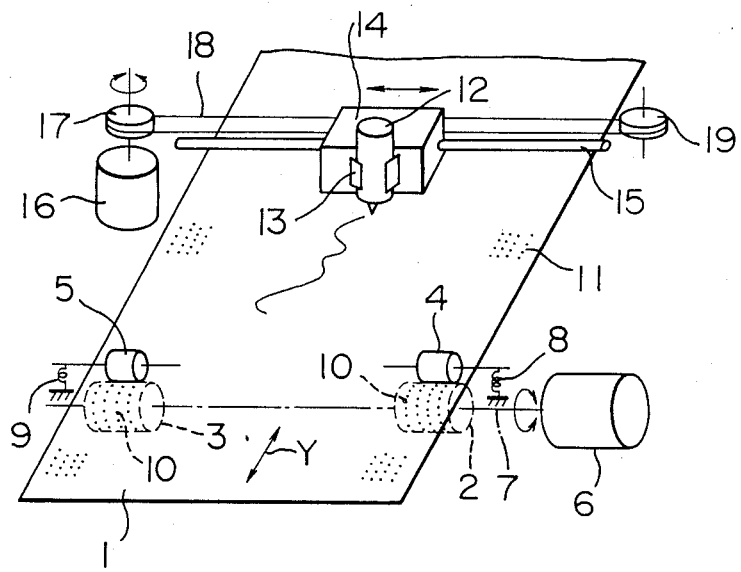
FIG. 1 is a perspective view the X-Y plotter according to an embodiment of this invention for showing the operation principle of the plotter.

In FIG. 1 a recording paper 1 is pinched or nipped between drive rollers 2, 3 and pinch rollers 4, 5, with the two drive rollers 2, 3 being both connected with a paper feed motor 6 through a drive shaft 7, and rotated by the feed motor 6 for moving the recording paper 1 forward or backward (in direction Y in FIG. 1). The drive rollers 2, 3 are made of metal (in this embodiment, of brass), and each drive roller 2, 3 is formed on its outer surface with sharp and regularly arranged minute projections 10. The pinch rollers 4, 5 are made of rubber having hardness of about 80 degrees, and pressed against the drive rollers 2, 3 with a suitable contact pressure by springs 8, 9, respectively. By these arrangements, in the paper feed, the recording paper 1 is stamped with fine dents or fine thrust holes 11 by the minute projections 10 of the drive rollers during the paper feed. Once the dents or thrust holes 11 have been stamped on or in the paper 1, they serve as positioning means for the paper feed, and prevent the slipping of the recording paper 1 relative to the drive rollers 2, 3. This non-slip feature can not be obtained by a feed system of prior art which utilizes only frictional force acting between paper and roller.

A recording pen 12 is fixed to a pen carriage 14 through a holder 13, and is movable in a direction X perpendicular to the paper feed direction in a plane of the recording paper 1. The pen carriage 14 is driven along a guide rod 15 by a pen drive motor 16 through a drive pulley 17, an idler pulley 19, and a drive string 18 which is extended around the two drive pulleys 17, 19 and is secured to the pen carriage 14 at its both ends.

By suitably operating the paper feed motor 6 and the pen drive motor 16, any desired figure can be drawn on the recording paper 1.

Figures 2A, 2B:
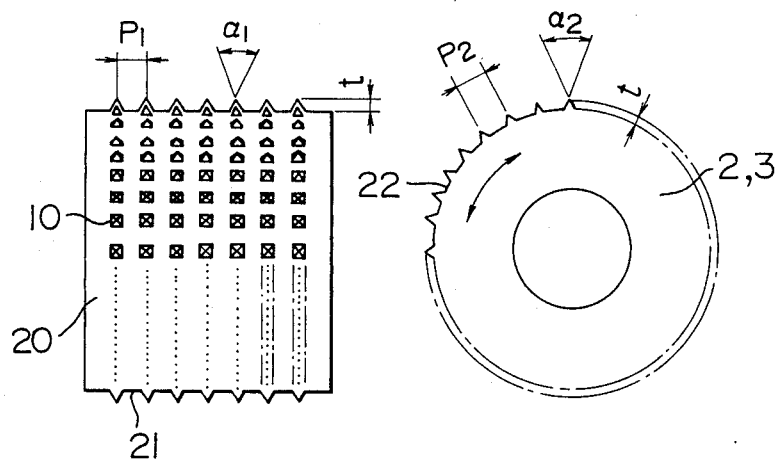
FIGS. 2A and 2B are a detailed side view and a detailed front view of the drive roller, respectively.

In FIGS. 2A and 2B, the drive roller 2, 3 are fabricated by machining a brass rod, wit the roller having, on and outer surface thereof, several parallel circumferential grooves 21 of a trapezoidal crosssectional shape arranged in pitch $P_1$ and also with several parallel axial grooves 22 of a similar crosssectional shape arranged in pitch $P_2$. Thus, on the outer surface of the drive roller serving as a cylindrical reference surface 20 are formed a plurality of minute projections 10 of a quadrangular pyramid shape. These minute projections 10 achieve an important function to stamp dents or depressions and/or stick holes 11 (in FIG. 3) on/in the recording paper 1 for ensuring a precise and steady movement of the recording paper 1. In order to make the top of each minute projection 10 sufficiently sharp and still to maintain the same as sufficiently stiff, the vertical angles $\alpha_1$, $\alpha_2$ are preferred to be in the range of 60°~90°. The pitches $P_1$ and $P_2$ should be selected in dependence upon the diameter of the drive rollers 2, 3 and on the diameter and hardness of the pinch rollers 4, 5. Typically, the pitches $P_1$, $P_2$ are i the range of 0.3 mm~1 mm, while the height of the projection may be typically in the range of 0.05 mm~0.2 mm.

FIGS. 3A and 3B show minute projections 10 of quadriagular pyramidal shape thrusting into the recording paper 1. The recording paper 1 is pierced by the minute projections 10 to have minute thrust holes 11 formed therein. From FIGS. 3A and 3B, it will be understood that the sharper top ends of the minute projections 10 are, the easier the minute holes 11 are ensured to be formed in the paper 1 which are suitable to feed the recording paper 1 by the rollers without slippage during a X-Y plotter operation. Further, since the minute projections 10 are formed by cutting or machining the circumferentially and axially extending grooves each having a trapezoidal crosssectional shape, each of the minute projetions 10 has a regular quadrangular pyramidal shape, which is so oriented that one pair of opposing triangular side planes 24 are parallel to the longitudinal or feed direction X of the paper, while ridge lines 23 of the quadrangular pyramidal shape which is likely to break the recording paper 1 is away from the feed direction X of the recording paper 1. In such arrangement of the minute projections 10, recording paper 1 feed force is transferred from the minute projection 10 to the recording paper 1 through periphery of the thrust hole 11, where the thrust hole 11 is shaped to be most deformation-resistant against the paper feed force in the direction X. In addition, the periphery of each thrust hole 11 is shaped to be deformation-resistant against the force in the direction orthogonal to the direction X.

Thus, the axial and circumferential groove machining enables to provide the quadragular pyramidal shape the minute projections 10 oriented and arranged in such a manner that the deformation of the thrust hole 11 as well as the positional deviation of the paper 1 with respect to the drive rollers 2, 3 can be minimized.

In addition, because the height of the minute projection 10 from the cylindrical reference surface 20 is selected appropriately, the thrust depth of the minute projections 10 into the recording paper 1 can be made substantially constant and the recording paper 1 can be directly supported by the reference surface 20 of the drive roller as well. Therefore, there is no fear of uncontrollable enlargement or expansion, during paper feed, or of the hole which is unavoidable in case of a drive roller having deep grooves or relatively long projections without cylindrical reference surface.

Further, the greater stress was applied to the thrust peripheries of the holes 11 in the recording paper 1 in the conventional apparatus, because the paper feed force was applied to the paper substantially only by way of the side faces of the projections of the roller. In contrast to the conventional apparatus, as shown in FIG. 4, the recording paper 1 is pressed on the basic or reference surface 20 by pinch rollers 4, 5 with a force P, producing a frictional force $\mu P$ ($\mu$: friction coefficient) between the recording paper 1 and the cylindrical surface 20 of the drive rollers 2, 3. Therefore, the paper feed force is constituted not only by the pushing force from the minute projections 10, but also, in addition, by a frictional force, thereby relieving the load acting on the peripheries of the thrust holes 11, minimizing expansion of the thrust holes 11, and assuring a long time operation of the plotter even when the recording paper 1 is thin and lacking in the stiffness or rigidity.

Moreover, as the recording paper 1 can be guided along the cylindrical surface 20 serving as the reference surface, the recording paper 1 can be accurately fed regardless of the thickness thereof without variation in the paper feed length depending on the thickness because there is no fear the minute projections 10 may be thrust into the recording paper 1 gradually deeper in the conventional apparatus.

In addition, there is no need of subtle adjustment of the force of the spring, because the thrust depth can be kept constant so long as the forces of the springs 8, 9 for pressing the pinch rollers 4, 5 are greater than those required to thrust the minute projections 10 into the recording paper 1. In the apparatus according to the invention, because the cylindrical reference surface and the quadrangular pyramidal shape of the minute projections 10 having sharp top ends on the surface are provided at the outer periphery of the drive rollers 2, 3, the thrust depth of the minute projections 10 into the recording paper 1 can be kept constant regardless of the thickness and/or stiffness of the recording paper 1 and highly accurate paper feed can be ensured for a long time.

We claim:

1. An X-Y plotter comprising:

a recording paper;

a recording means for recording on said recording paper;

first drive means for moving said recording means in an X direction;

at least one set of a drive roller means and a pinch roller means disposed for pinching said recording paper therebetween; and second drive means for rotating said drive roller means to move said recording paper in a Y direction which is orthogonal to said X direction;

wherein said drive roller has a cylindrical reference surface and a plurality of minute projections projecting from the cylindrical reference surface and being arranged in discreet regular pitches such that adjacent projections are spaced from each other with a part of the cylindrical reference surface therebetween, each projection having a quadrangular pyramidal shape.

2. An X-Y plotter according to claim 1, wherein said drive roller means is fabricated by machining a cylindrical metal rod.

3. An X-Y plotter comprising:

a recording paper;

a recording element for recording on said recording paper;

first drive means for moving said recording element in an X direction;

at least one set of a drive roller and a pinch roller disposed for pinching said recording paper therebetween; and second drive means for rotating said drive roller to move said recording paper in a Y direction which is orthogonal to said X direction;

wherein said drive roller has a cylindrical reference surface and a plurality of minute projections arranged in regular pitches, each projection projecting from the cylindrical reference surface and having a quadrangular pyramidal shape, said quadrangular pyramidal shape of the minute projections is oriented such that at least one side plane of the pyramid extends substantially parallel to said X direction.

4. An X-Y plotter according to claim 1, wherein said drive roller means is made of brass.

5. An X-Y plotter comprising:

a recording paper;

a recording element for recording on said recording paper;

first drive means for moving said recording element in an X direction;

at least one set of a drive roller and a pinch roller made of rubber disposed for pinching said recording paper therebetween; and second drive means for rotating said drive roller to move said recording paper in a Y direction which is orthogonal to said X direction;

wherein said drive roller has a cylindrical reference surface and a plurality of minute projections arranged in regular pitches, each projection projecting from the surface and having the quadrangular pyramidal shape.

6. An X-Y plotter comprising:

a recording paper;

a recording element for recording on said recording paper;

first drive means for moving said recording element in an X direction;

at least one set of a drive roller and a pinch roller disposed for pinching said recording paper therebetween; and second drive means for rotating said drive roller to move said recording paper in a Y direction which is orthogonal to said X direction;

wherein said drive roller has a cylindrical reference surface and a plurality of minute projections arranged in regular pitches, each projection projecting from the reference surface and having a quadrangular pyramidal shape, each of said minute projections has a vertical angle in a range of 60° to 90°.

7. An X-Y plotter comprising:

a recording paper;

a recording element for recording on said recording paper;

first drive means for moving said recording element in an X direction;

at least one set of a drive roller means and a pinch roller means disposed for pinching said recording paper therebetween; and second drive means for rotating said drive roller to move said recording paper in a Y direction which is orthogonal to said X direction;

wherein said drive roller has a cylindrical reference surface and a plurality of minute projections arranged in regular pitches, each projection projecting from the reference surface and having a quadrangular pyramidal shape, said pitch of the minute projections is in a range of 0.3 to 1 millimeter.

8. An X-Y plotter comprising:

a recording paper;

a recording element for recording on said recording paper;

first drive means for moving said recording element in an X direction;

at least one set of a drive roller means and a pinch roller means disposed for pinching said recording paper therebetween; and second drive means for rotating said drive roller to move said recording paper in a Y direction which is orthogonal to said X direction;

wherein said drive roller has a cylindrical reference surface and a plurality of minute projections arranged in regular pitches, each projection projecting from the reference surface and having a quadrangular pyramidal shape, each of said minute projections has a height in a range of 0.05 to 0.02 millimeters.

* * * * *